(12) United States Patent
Wagenblast

(10) Patent No.: US 10,578,049 B2
(45) Date of Patent: Mar. 3, 2020

(54) THERMAL BARRIER COATING FOR ENGINE COMBUSTION COMPONENT

(71) Applicant: Mahle International GmbH, Stuttgart (DE)

(72) Inventor: Joachim Wagenblast, Bloomfield Hills, MI (US)

(73) Assignee: Mahle International GmbH (DE)

( * ) Notice: Subject to any disclaimer, the term of this patent is extended or adjusted under 35 U.S.C. 154(b) by 365 days.

(21) Appl. No.: 15/499,990

(22) Filed: Apr. 28, 2017

(65) Prior Publication Data
US 2018/0313294 A1  Nov. 1, 2018

(51) Int. Cl.
*F02F 3/00* (2006.01)
*F02F 3/26* (2006.01)
*C22C 14/00* (2006.01)
*C23C 4/123* (2016.01)
*C23C 4/08* (2016.01)
(Continued)

(52) U.S. Cl.
CPC ........ *F02F 3/0084* (2013.01); *B23K 26/0006* (2013.01); *B23K 26/34* (2013.01); *B33Y 10/00* (2014.12); *C22C 14/00* (2013.01); *C23C 4/08* (2013.01); *C23C 4/123* (2016.01); *C23C 4/18* (2013.01); *C23C 14/165* (2013.01); *C23C 16/06* (2013.01); *C23C 28/021* (2013.01); *F02F 3/14* (2013.01); *F02F 3/26* (2013.01); *B23K 2101/003* (2018.08); *B23K 2101/34* (2018.08); *B23K 2103/04* (2018.08);
(Continued)

(58) Field of Classification Search
CPC .... F02F 3/0084; F02F 3/14; F02F 3/26; F02F 2200/00; C23C 28/021; C23C 4/18; C23C 16/06; C23C 14/165; C23C 4/08; C23C 4/123; B23K 26/0006; B23K 26/34; B23K 2101/003; B23K 2103/26; B23K 2103/04; B23K 2103/14; B23K 2101/34; C22C 14/00; B33Y 10/00; F05C 2251/048
See application file for complete search history.

(56) References Cited

U.S. PATENT DOCUMENTS 2,101,045 A   6/1936  Blettner
2,833,264 A   5/1958  Dailey
(Continued)

FOREIGN PATENT DOCUMENTS

DE   454809 C   1/1928
DE   744252 C   1/1944
(Continued)

OTHER PUBLICATIONS

ThermoPhysical Properties of 60-NITINOL for Mechanical Component Applications (Year: 2012).*
Thermal Barrier Coating Clusters; Article dated Sep. 23, 2014.

Primary Examiner — Hung Q Nguyen
(74) Attorney, Agent, or Firm — Fishman Stewart PLLC

(57) ABSTRACT

A piston for an internal combustion engine includes a piston body having a top surface and having formed therein a combustion bowl surface, a base material of the piston body having a first thermal conductivity, a first layer of metal bonded to the top surface of the piston body, the first layer of metal having a second thermal conductivity that is lower than the first thermal conductivity, and a second layer of metal bonded to the first layer, the second layer of metal having a third thermal conductivity that is higher than the second thermal conductivity.

20 Claims, 3 Drawing Sheets

(51) Int. Cl.

| | | |
|---|---|---|
| *C23C 14/16* | (2006.01) | |
| *C23C 16/06* | (2006.01) | |
| *B33Y 10/00* | (2015.01) | |
| *B23K 26/34* | (2014.01) | |
| *B23K 26/00* | (2014.01) | |
| *F02F 3/14* | (2006.01) | |
| *C23C 4/18* | (2006.01) | |
| *C23C 28/02* | (2006.01) | |
| *B23K 101/34* | (2006.01) | |
| *B23K 103/14* | (2006.01) | |
| *B23K 101/00* | (2006.01) | |
| *B23K 103/18* | (2006.01) | |
| *B23K 103/04* | (2006.01) | |

(52) U.S. Cl.
CPC ...... *B23K 2103/14* (2018.08); *B23K 2103/26* (2018.08); *F02F 2200/00* (2013.01); *F05C 2251/048* (2013.01)

(56) References Cited

U.S. PATENT DOCUMENTS

| | | | |
|---|---|---|---|
| 3,149,409 A | 9/1964 | Maruhn | |
| 3,203,321 A * | 8/1965 | Rosen | C23C 4/02 |
| | | | 188/218 R |
| 3,911,891 A | 10/1975 | Dowell | |
| 4,538,562 A | 9/1985 | Matsui et al. | |
| 4,830,932 A | 5/1989 | Donomoto et al. | |
| 8,757,124 B2 | 6/2014 | Hoeg | |
| 8,763,247 B2 | 7/2014 | Kopchick et al. | |
| 2013/0025561 A1* | 1/2013 | Gabriel | C23C 4/04 |
| | | | 123/193.6 |
| 2013/0118438 A1* | 5/2013 | Lineton | B05D 5/00 |
| | | | 123/193.6 |
| 2013/0327289 A1 | 12/2013 | Hiratsuka et al. | |
| 2014/0196439 A1* | 7/2014 | Dolan | F01L 3/04 |
| | | | 60/274 |
| 2014/0290617 A1* | 10/2014 | Tomita | F02B 77/11 |
| | | | 123/193.5 |
| 2014/0352646 A1 | 12/2014 | Tomita et al. | |
| 2015/0204269 A1* | 7/2015 | Hiratsuka | F02B 77/11 |
| | | | 123/193.3 |
| 2016/0177864 A1* | 6/2016 | Sasaki | F02F 3/14 |
| | | | 123/193.6 |
| 2017/0248099 A1* | 8/2017 | Wagner | F01B 7/14 |
| 2017/0284333 A1* | 10/2017 | Kawanaka | C23C 24/08 |
| 2018/0128166 A1* | 5/2018 | Lineton | F02F 3/12 |

FOREIGN PATENT DOCUMENTS

| | | | | |
|---|---|---|---|---|
| FR | 1460183 A | | 11/1966 | |
| JP | 60182341 | | 9/1985 | |
| JP | 60184950 A | * | 9/1985 | ............. F02B 77/11 |
| JP | 60184951 | | 9/1985 | |
| JP | 60184951 A | * | 9/1985 | ............. F02B 77/11 |
| JP | 60240855 | | 11/1985 | |
| JP | 62045964 | | 2/1987 | |
| JP | 63179167 | | 7/1988 | |
| JP | 63255552 | | 10/1988 | |
| JP | 2123255 | | 5/1990 | |
| WO | 09000420 | | 12/2008 | |
| WO | 16076341 A1 | | 5/2016 | |
| WO | 16096857 A1 | | 6/2016 | |
| WO | 16163244 A1 | | 10/2016 | |

* cited by examiner

THERMAL BARRIER COATING FOR ENGINE COMBUSTION COMPONENT

BACKGROUND

A power cylinder assembly of an internal combustion engine generally includes a reciprocating piston disposed within a cylindrical cavity of an engine block. One end of the cylindrical cavity may be closed while another end of the cylindrical cavity is open. The closed end of the cylindrical cavity and an upper portion or crown of the piston defines a combustion chamber. The open end of the cylindrical cavity permits oscillatory movement of a connecting rod, which joins a lower portion of the piston to a crankshaft, which is partially submersed in an oil sump. The crankshaft converts linear motion of the piston (resulting from combustion of fuel in the combustion chamber) into rotational motion.

Internal combustion engines, and in particular the pistons of such engines, are under increased stress as a result of efforts to increase overall efficiency, e.g., by reducing piston weight and/or increasing pressures and temperatures associated with engine operation. Thus, to improve engine performance, increase engine efficiency, and reduce fuel consumption, engine designs have been reduced in size in recent years. As engine size has reduced, combustion temperatures have correspondingly and generally increased. Piston cooling is therefore increasingly important for withstanding the increased stress of such operational conditions over the life of the engine.

Known piston designs include a combustion bowl facing the combustion chamber, the combustion bowl typically having a curved shape that optimizes power output of the piston during the combustion process. That is, typically the shape of the combustion bowl is selected such that the flame front grows optimally into the curved combustion bowl during each combustion event to maximize power output.

Known piston designs also typically include cooling galleries disposed approximately about a circumference of the combustion bowl, allowing for coolant fluid to pass through and remove heat during piston operation. Crankcase oil is introduced into the cooling gallery, and the coolant removes combustion energy that passes via conduction into the piston. However, in comparison to the very rapid combustion process, conduction to the cooling gallery is relatively slow. Thus, although the crankcase oil passing through the cooling gallery may be sufficient to remove the heat passing into the piston, peak temperatures occur on a surface of the combustion bowl during the combustion process well in excess of the temperature of the crankcase oil.

It has been used in the past to provide thermal barrier coating with various ceramics that have low thermal conductivity properties, but the end result had poor life due to cracking and failure of the ceramic coating and in particular the coating adhesion to the piston body. In addition, the surface temperature may increase due to the coating resulting in inefficiencies and possible knocking concerns.

Accordingly, there is a need for a robust, lightweight piston design that allows adequate cooling, such as by providing a cooling gallery, while simplifying construction of the piston, while increasing the adhesion and durability of the thermal coating.

BRIEF DESCRIPTION OF THE DRAWINGS

Referring now to the drawings, exemplary illustrations are shown in detail. Although the drawings represent representative examples, the drawings are not necessarily to scale and certain features may be exaggerated to better illustrate and explain an innovative aspect of an illustrative example. Further, the exemplary illustrations described herein are not intended to be exhaustive or otherwise limiting or restricting to the precise form and configuration shown in the drawings and disclosed in the following detailed description. Exemplary illustrations are described in detail by referring to the drawings as follows.

DETAILED DESCRIPTION

Reference in the specification to "an exemplary illustration", an "example" or similar language means that a particular feature, structure, or characteristic described in connection with the exemplary approach is included in at least one illustration. The appearances of the phrase "in an illustration" or similar type language in various places in the specification are not necessarily all referring to the same illustration or example.

Various exemplary illustrations are provided herein of pistons and methods of making the same. An exemplary piston assembly may include a piston crown and skirt. The crown may include radially inner and outer crown mating surfaces, and the crown may define at least in part a cooling gallery extending about a periphery of the crown. The crown may further include a crown collar wall extending downward toward a free end of the crown collar wall. The skirt may include a pair of oppositely disposed pin bosses that each define piston pin bores configured to receive a piston pin for securing a connecting rod between the pin bosses. The skirt may further include a radially inner skirt mating surface abutted along a radially inner interface region with the radially inner crown mating surface, and a radially outer skirt mating surface abutted along a radially outer interface region with the radially outer crown mating surface such that the cooling gallery is substantially enclosed. The skirt may further include an inner collar wall disposed radially inwardly of the radially inner interface region and extending upwards to the free end of the crown collar wall.

Figure 1:
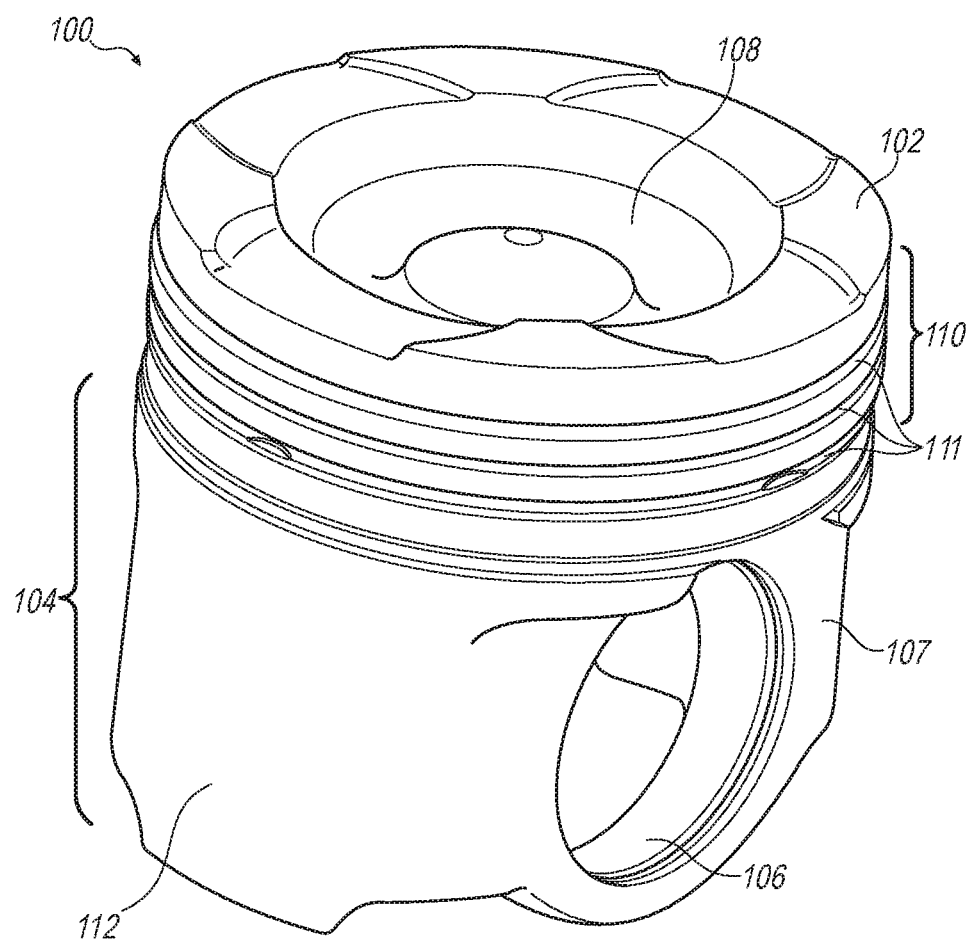
FIG. 1 is a perspective view of an exemplary piston assembly.

Turning now to FIG. 1, an exemplary piston assembly 100 is illustrated. Piston assembly 100 may include a piston crown 102 and a piston skirt 104. The piston crown 102 may include a combustion bowl 108 and a ring belt portion 110 that is configured to seal against an engine bore (not shown) receiving the piston assembly 100. For example, the ring belt portion 110 may define one or more circumferential grooves 111 that receive piston rings (not shown), which in turn seal against engine bore surfaces during reciprocal motion of the piston assembly 100 within the engine bore.

The piston skirt 104 generally supports the crown 102 during engine operation, e.g., by interfacing with surfaces of an engine bore (not shown) to stabilize the piston assembly 100 during reciprocal motion within the bore. For example, the skirt 104 may have an outer surface 112 that generally defines a circular outer shape about at least a portion of a perimeter of the piston assembly 100. The outer shape may correspond to the engine bore surfaces, which may be generally cylindrical. The outer surface 112 of the skirt 104 may generally slide along the bore surfaces as the piston moves reciprocally within the bore.

The skirt 104 may also include piston pin bosses 107. The piston pin bosses 107 may generally be formed with apertures 106 configured to receive a piston pin (not shown). For example, a piston pin may be inserted through the apertures in the piston pin bosses 107, thereby generally securing the skirt 104 to a connecting rod (not shown). The pin bosses 107 generally define an open area between the pin bosses 107, e.g., for receiving the connecting rod (not shown).

Figure 2:
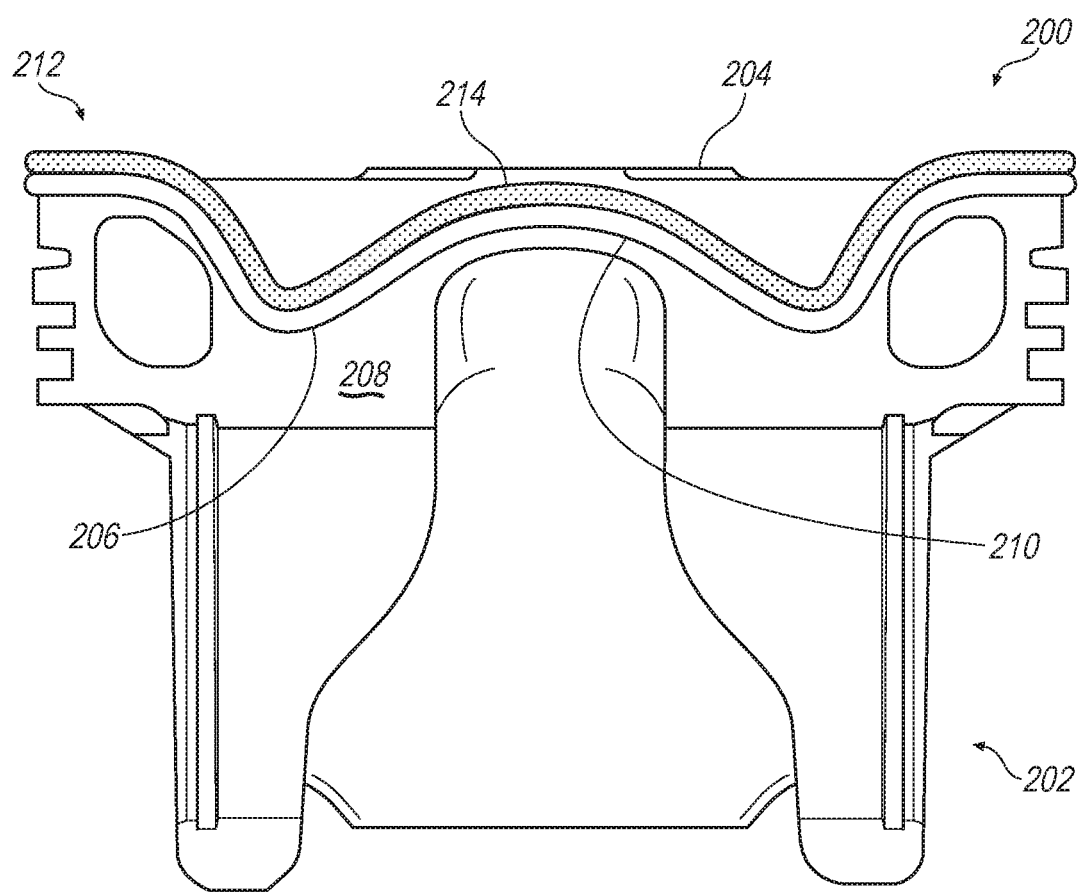
FIG. 2 illustrates a cross-sectional view of a piston having first and second metal layers.

Turning now to FIG. 2, a piston 200 for an internal combustion engine includes a piston body 202 having a top surface 204 and having formed therein a combustion bowl surface 206. A base material 208 of the piston body 202 includes a first thermal conductivity. A first layer of metal 210 is bonded to the combustion bowl surface 206, as well as an outer region 212 of the top surface 204. The first layer of metal 210 has a second thermal conductivity that is lower than the first thermal conductivity. A second layer of metal 214 is bonded to the first layer of metal 210, the second layer of metal 214 has a third thermal conductivity that is higher than the second thermal conductivity. And, although the first and second layers of metal 210, 214 are described as metal, they may in fact be metal alloys, so long as the relative differences between layers and pertaining to both their thermal conductivities and heat capacities are maintained. Accordingly, any reference to a metal or a layer of metal is in fact generally referring to a metal or an alloy of metal. The first layer of metal 210 also has an additional benefit of increase adhesion to the surface 204 of the piston body 202. The metal alloy reduces the likelihood of the coating from delaminating from the surface over the life of the engine.

Further, it is contemplated that the first and second layers of metal 210, 214 are generally applied throughout the entire top surface 204, to include combustion bowl surface 206 as well as outer region 212. The application may be limited to areas that experience the highest temperatures since the added coating may reduce the conduction of heat through the piston body 202. In addition, the application may further include areas of the ring belt just below the top surface 204. It is further contemplated that layers of metal 210, 214 are to be applied specifically to areas of the piston body. Thus, in some designs the coating may only be along an outer perimeter of the piston, such as in outer region 212, and in others the coating may only be applied to the combustion bowl surface 206. The coating may vary in application based on the observed temperature and need to reduce the conduction of the combustion heat through the piston body 202 and reduced surface temperatures due to the lower thermal capacity of the second layer of metal 214, as will be further explained below.

Typically, the first layer of metal 210 is deposited on or bonded to base material 208 using bonding steps that include but are not limited to one of a thermal spray process, a laser cladding process, and an electroplating process. The second layer of metal 214 is deposited on or bonded to the first layer of metal 210, also using one of a thermal spray process, a laser cladding process, and an electroplating process, although the method of application of the second layer of metal 214 may be different than that of the first layer of metal 210 to base material 208. Deposition techniques for bonding one or both of first layer of metal 210 and second layer of metal 214 include but are not limited to physical vapor deposition (PVD), evaporation, chemical vapor deposition (CVD), vacuum deposition, sputter deposition, and 3D printing, as examples. In such fashion the materials are bound together to have a minimally impacted thermal barrier between them. That is, the thermal interface between materials is minimal, thus conduction between layers 210, 214 and to the base material 208 with minimal thermal interface resistance between layers. In other words, the bonding process between layers in some methods leaves minimal pores but is direct metal on metal between layers and throughout the surfaces.

The first layer of metal 210 includes a first heat capacity, and the second layer of metal 214 includes a second heat capacity that is lower than the first heat capacity. In one example, the first layer of metal 210 includes titanium, such as an alloy of titanium. And, in one further example, the first layer of metal 210 is TiAl6V4. The first layer of metal 210 has a thickness of 10-500 microns, according to disclosed examples, but may have a greater thickness according to the following description of operation of the disclosed subject matter. In one example the thickness may be as much as 200 microns, and in another example even greater than 200 microns. In some thermal spray operations the first layer of metal 210 may be various metals and incorporate glass beads or glass hollow beads to decrease the thermal conductivity of the first metal layer. Also, in another example the second layer of metal 214 includes nickel. In another example the second layer of metal 214 has a thickness of 1-10 microns, according to disclosed examples, but may have a lesser thickness according to the description of operation of the disclosed subject matter. However, in some examples, depending on life expectancy of second layer of metal 214, deposition techniques, and the like, such thicknesses may not be desirable. Thus, second layer of metal 214 may include a thickness up to 100 microns in another example, and even greater than 100 microns as necessary. The second layer of metal 214 may also provide corrosion protection due to the combustion gas environment to both the first layer and base material.

Typically, pure nickel has a thermal conductivity of approximately 70 W/m-K, and that of TiAl6V4 has a thermal conductivity of approximately 6.6 W/m-K. These are in comparison to the base material 208 of piston 200 that may be steel, having a thermal conductivity of 54 W/m-K, in one example. Pure nickel has a thermal capacity or, as also referred to in the industry, a heat capacity of approximately 456 J/kg-K, while TiAl6V4 has a heat capacity of approximately of 526 J/kg-K. Thus, as disclosed herein, the first layer of metal 210 has a heat capacity that is greater than that of the second layer of metal 214, and the first layer of metal 210 has a thermal conductivity that is lower than that of the second layer of metal 214.

Thus, in one example and for the purposes of describing operation of the disclosed subject matter, the first layer of metal 210 includes perhaps 10-50 microns of TiAl6V4, and the second layer of metal 214 includes perhaps 1-10 microns of pure nickel. Or, more generally, the base material 208 includes material having a first thermal conductivity. The first layer of metal 210 is adhered thereto, to both the combustion bowl surface 206, as well as to the outer region 212 surrounding the combustion bowl surface 206. The first layer of metal 210 includes a second thermal conductivity that is lower than the first thermal conductivity. The second layer of metal 214 is bonded to the first layer of metal 210, and the second layer of metal (which may be only in the combustion bowl surface 206 or may include the outer region 212, as well, according to the disclosure) and has a third thermal conductivity that is higher than the second thermal conductivity. The region above upper surface 204, as is commonly known, is a region that is captured within the cylinder and in the combustion region above the piston and may be referred to as a combustion chamber.

Figure 3A:
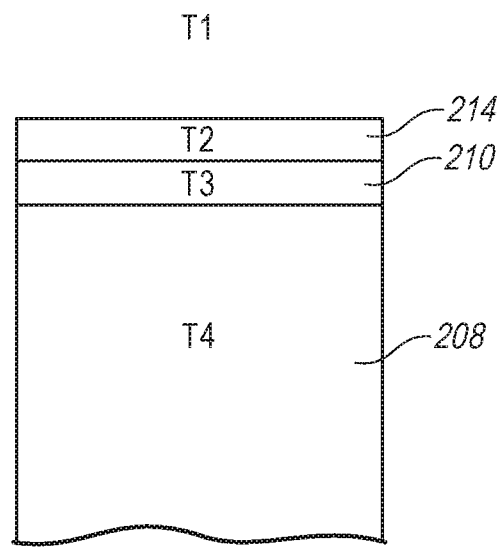
FIG. 3A illustrates a portion of a cross-section of the piston of FIG. 2 having different temperature regions.

During operation, temperatures T1, T2, T3, and T4 will be described, which are illustrated in FIG. 3A. Temperature T1 refers generally to a region above the piston upper surface, such as in the combustion chamber, and is generally where combustion occurs in an engine, as well as where an air/fuel mixture is injected. Post-combustion, the combustion products are removed from the combustion chamber and may be replaced with air during operation and prior to the introduction of the air/fuel mixture. Temperature T2 refers to a temperature of second layer of metal 214, T3 refers to a temperature of the first layer of metal 210, and temperature T4 refers to that of the base material 208 of the piston assembly 100.

Figure 3B:
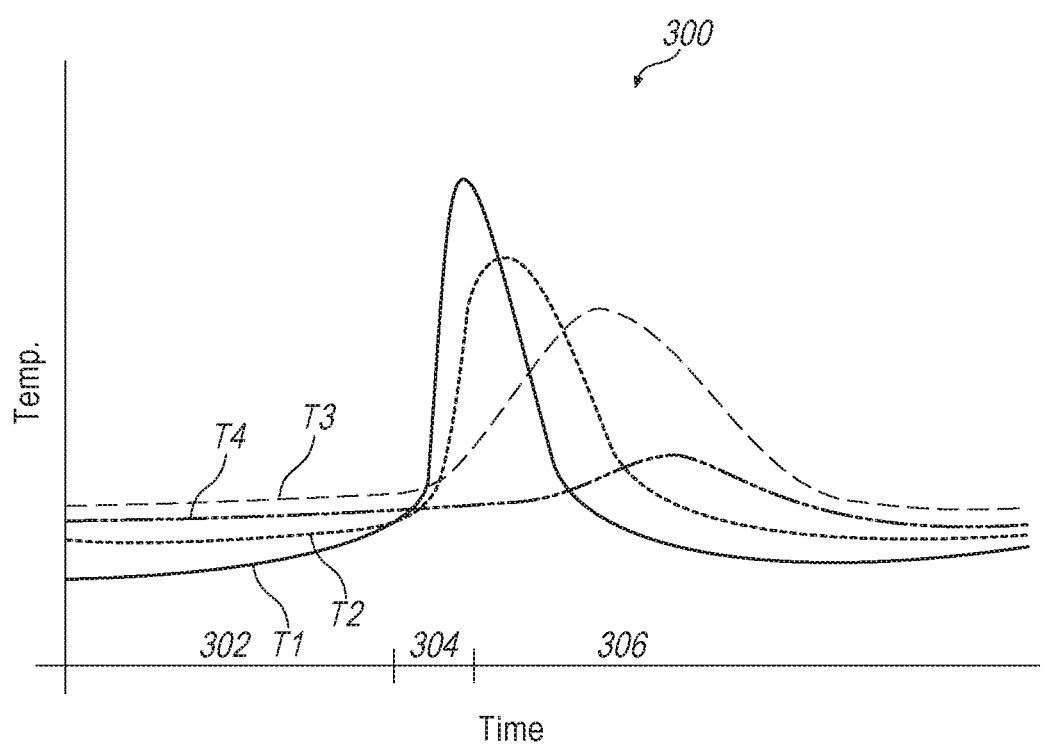
FIG. 3B is a qualitative representation of the temperature regions of FIG. 3A as a result of the combustion process.

Although it is generally understood that temperature gradients occur within each of the illustrated regions, the following in FIG. 3B is a simplification of the disclosed process, for discussion purposes only. Thus, generally uniform temperatures are illustrated in each region or material during each phase of operation. That is, FIG. 3B, correspondingly, includes a graphical and qualitative illustration of the temperatures T1, T2, T3, and T4 during relevant phases of the combustion process and piston operation. However, it is to be understood that the operation described herein does not represent an entire set of steps that occurs pre and post combustion. Rather, only relevant steps are illustrated for the purposes of describing in simplified and qualitative terms the benefits of the disclosed subject matter. Also, although the horizontal line generally represents a time axis and the vertical line illustrates a temperature axis, it is understood that the relative times and temperatures are just that—relative to each other. The actual times and temperatures relative to one another during each phase illustrated are in no way intended be construed in the Figures.

FIG. 3B illustrates a graphical illustration 300 of temperatures that occur during a first or pre-combustion period 302, during a combustion period 304, and during a post-combustion period 306. During the pre-combustion period 302, it is presumed that an air-fuel mixture has been injected or otherwise introduced into the combustion chamber. Temperature T1 in the combustion chamber is thereby relatively cool, in comparison to the other temperatures. Temperature T4 in this region 302 represents the base material 208 and is relatively warmer than the surrounding fluid T1 during this period. Temperature T3 at this point (first layer of metal 210), having a relatively high heat capacity (compared to second layer 214) and also a lower thermal conductivity, presents somewhat of a thermal barrier between the base material 208 and second layer of metal 214. Accordingly, with second layer of metal 214 in thermal contact with the much colder surrounding fluid T1, its temperature T2 is thereby lower than that of T3.

During combustion 304, however, temperature T1 increases dramatically and is a peak temperature in the system and represents relative temperatures that occur during the combustion process. Second layer of metal 214 (temperature T2), being in direct thermal contact with the combustion chamber, increases dramatically, as well, and having a relatively high thermal conductivity and a relatively low heat capacity, reacts in temperature very rapidly compared to the first layer of metal 210. Temperature T3 thus increases as well, but does not reach the peak temperature of the second layer of metal 214, because its heating is from conduction via second layer of metal 214. Temperature T4 also increases, but in much more modest magnitude (when considered generally as a bulk temperature, again recognizing that in reality significant gradients will occur therein).

Post combustion 306, the combustion products are exhausted from the combustion region, and temperature T1 drops dramatically as relatively cool air is introduced into the combustion chamber. However, given the relatively high thermal conductivity and low heat capacity of the second layer of metal 214, its temperature T2 drops rapidly as it follows the temperature T1. Temperature T3, that of the first layer of metal 210, having a relatively lower thermal conductivity and a relatively high heat capacity, follows in temperature slower than that of the second layer of metal 214, and also does not cool as much as the second layer of metal 214, either. Thus, first layer of metal 210 effectively forms a thermal barrier during the process pre to post combustion, thereby allowing rapid and greater swings in the temperature of the second layer of metal 214.

In addition and as indicated, first layer of metal 210 includes a thickness in a range of 10-500 microns, and second layer of metal 214 includes a thickness in a range of 1-200 microns. As mentioned, however, first layer of metal 210 may be as much as 200 microns in one example, and even greater than 200 microns in another example. Thus, second layer of metal 214, having both a higher thermal conductivity and a lower heat capacity than first layer of metal 210, thereby reacts in temperature changes much more rapidly than that of first layer of metal 210. As such, it is desirable for second layer of metal 214 to be as thin as reasonably possible, while meeting other requirements of the piston, such as its life expectancy requirements. First layer of metal 210, on the other hand, providing a thermal barrier between second layer of metal 214 and base material 208, is thereby optimally and relatively thicker than second layer 214 of metal. In other words, second layer of metal 214 is optimally as thin as may be reasonably deposited (such as 1-10 microns, or up to 100 microns), so long as life requirements of the piston are met. First layer of metal 210 is optimally thicker than that of second layer of metal 214 (such as 10-50 microns, or up to 200 microns and beyond), and may be yet thicker according to the disclosure, limited by such items as the ability to sufficiently and economically deposit yet thicker material. The thickness of the first layer 210 and second layer 214 may be adjusted to obtain a desired heat flux through the piston body 202.

Accordingly, and according to the disclosure, the relatively rapid temperature response of the second layer of metal 214, and its corresponding decrease in temperature that follows that of temperature T1 post-combustion. The reduction of the temperature of the hot surface within the combustion cycle of the engine helps to avoid in losing volumetric efficiency of the intake cycle, pre-combustion area. Since the intake air will not be warmed as quickly allowing for the cylinder to intake a larger volume of air that remains at a cooler temperature as the cylinder is filled. The larger volume of air thereby allows for higher compression during the compression stroke of the piston. In addition, the increased surface temperature during combustion of the second layer may allow for a faster combustion of the fuel-air mixture. Finally the lower thermal capacity, higher thermal conductivity and thickness, as discussed above, allows for the second layer of metal 214 to cool quickly reducing the temperature at the surface of the piston. Optionally, using a venting approach in a Miller cycle or Atkinson cycle may allow for the surface of the piston to be further cooled and therefore keep volumetric efficiency on an acceptable level. The venting of the combustion chamber is realized by a late closing of the exhaust valves. This change of combustion cycles has been useful in hybrid powertrains where torque and high output is not as critical as fuel economy. The dual layer coating may allow for further fuel economy gains through the thermal relationship of the thermal coating.

Thus, an exemplary method of fabricating a piston for an internal combustion engine includes forming a piston body having a top surface and having formed therein a combustion bowl surface, the piston body having a first thermal conductivity, bonding a first layer of metal to the top surface of the piston body, the first layer of metal having a second thermal conductivity that is lower than the first thermal conductivity, and bonding a second layer of metal bonded to the first layer, the second layer of metal having a third thermal conductivity that is higher than the first thermal conductivity.

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claimed invention.

Accordingly, it is to be understood that the above description is intended to be illustrative and not restrictive. Many embodiments and applications other than the examples provided would be upon reading the above description. It is anticipated and intended that future developments will occur in the arts discussed herein, and that the disclosed systems and methods will be incorporated into such future embodiments. In sum, it should be understood that the invention is capable of modification and variation.

All terms used in the claims are intended to be given their broadest reasonable constructions and their ordinary meanings as understood by those skilled in the art unless an explicit indication to the contrary in made herein. In particular, use of the singular articles such as "a," "the," "said," etc. should be read to recite one or more of the indicated elements unless a claim recites an explicit limitation to the contrary.

What is claimed is:

1. A piston for an internal combustion engine, comprising:
   a piston body having a top surface and having formed therein a combustion bowl surface, a base material of the piston body having a first thermal conductivity;
   a first layer of metal bonded to at least the combustion bowl surface, the first layer of metal having a second thermal conductivity that is lower than the first thermal conductivity; and
   a second layer of metal bonded to the first layer, the second layer of metal having a third thermal conductivity that is higher than the second thermal conductivity.

2. The piston according to claim 1, wherein the first layer of metal includes a first heat capacity, and the second layer of metal includes a second heat capacity that is lower than the first heat capacity.

3. The piston according to claim 1, wherein the first layer of metal includes titanium.

4. The piston according to claim 3, wherein the first layer of metal is TiAl6V4.

5. The piston according to claim 1, wherein the first layer of metal has a thickness of 10-500 microns.

6. The piston according to claim 1, wherein the second layer of metal includes nickel.

7. The piston according to claim 1, wherein the second layer of metal has a thickness of 1-200 microns.

8. A method of fabricating a piston for an internal combustion engine, comprising:
   forming a piston body having a top surface and having formed therein a combustion bowl surface, the piston body having a first thermal conductivity;
   bonding a first layer of metal to the combustion bowl surface of the piston body, the first layer of metal having a second thermal conductivity that is lower than the first thermal conductivity; and
   bonding a second layer of metal bonded to the first layer, the second layer of metal having a third thermal conductivity that is higher than the second thermal conductivity.

9. The method according to claim 8, wherein the first layer of metal includes a first heat capacity, and the second layer of metal includes a second heat capacity that is lower than the first heat capacity.

10. The method according to claim 8, wherein the first layer of metal includes titanium.

11. The method according to claim 10, wherein the first layer of metal is TiAl6V4.

12. The method according to claim 8, wherein the first layer of metal has a thickness of 10-500 microns.

13. The method according to claim 8, wherein the second layer of metal includes nickel.

14. The method according to claim 8, wherein the second layer of metal has a thickness of 1-200 microns.

15. The method according to claim 8, wherein the steps of bonding one of the first and second layers of metal includes one of a thermal spray process, a laser cladding process, an electroplating process, a physical vapor deposition (PVD) process, an evaporation process, a chemical vapor deposition process (CVD), a vacuum deposition process, a sputter deposition process, and a 3D printing process.

16. A piston for an internal combustion engine, comprising:
   a piston body;
   a first layer of metal bonded to a combustion surface of the piston body, the first layer having a thermal conductivity that is lower than that of the piston body; and
   a second layer of metal bonded to the first layer, the second layer of metal having a thermal conductivity that is higher than that of the first layer of metal;
   wherein the first layer of metal includes a first heat capacity, and the second layer of metal includes a second heat capacity that is lower than the first heat capacity.

17. The piston according to claim 16, wherein the first layer of metal is TiAl6V4.

18. The piston according to claim 16, wherein the first layer of metal has a thickness of 10-500 microns.

19. The piston according to claim 18, wherein the second layer of metal has a thickness of 1-200 microns.

20. The piston according to claim 16, wherein the second layer of metal includes nickel.

* * * * *